US009251868B2

(12) United States Patent
Fukushi et al.

(10) Patent No.: US 9,251,868 B2
(45) Date of Patent: Feb. 2, 2016

(54) MULTILAYERED SEMICONDUCTOR DEVICE

(71) Applicant: Renesas Electronics Corporation, Kawasaki-shi (JP)

(72) Inventors: Tetsuo Fukushi, Kawasaki (JP); Atsunori Hirobe, Kawasaki (JP); Muneaki Matsushige, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/676,735

(22) Filed: Apr. 1, 2015

(65) Prior Publication Data

US 2015/0287441 A1    Oct. 8, 2015

(30) Foreign Application Priority Data

Apr. 7, 2014 (JP) ................. 2014-078676

(51) Int. Cl.
| | |
|---|---|
| *G11C 5/14* | (2006.01) |
| *H01L 23/50* | (2006.01) |
| *H01L 23/48* | (2006.01) |
| *H01L 23/00* | (2006.01) |
| *H01L 25/065* | (2006.01) |
| *G11C 5/06* | (2006.01) |
| *G11C 5/02* | (2006.01) |

(52) U.S. Cl.
CPC .............. *G11C 5/147* (2013.01); *G11C 5/025* (2013.01); *G11C 5/063* (2013.01); *H01L 23/481* (2013.01); *H01L 23/50* (2013.01); *H01L 24/17* (2013.01); *H01L 25/0657* (2013.01); *H01L 2224/13025* (2013.01); *H01L 2224/16145* (2013.01); *H01L 2225/06517* (2013.01); *H01L 2225/06541* (2013.01); *H01L 2924/1434* (2013.01)

(58) Field of Classification Search
CPC .......... G11C 5/025; G11C 5/063; G11C 5/14; G11C 5/147; G11C 11/4074; H01L 23/481; H01L 23/50; H01L 24/17; H01L 25/043; H01L 25/0657; H01L 25/074; H01L 25/117; H01L 25/0756; H01L 25/06555; H01L 2224/13025; H01L 2224/16145; H01L 2225/06517; H01L 2225/06541; H01L 2225/06544

See application file for complete search history.

(56) References Cited

U.S. PATENT DOCUMENTS

| | | | |
|---|---|---|---|
| 8,638,006 B2* | 1/2014 | Im ............................. | G05F 1/56 307/18 |
| 8,913,443 B2* | 12/2014 | Pyeon ................. | H01L 25/0657 365/189.07 |
| 8,952,498 B2 | 2/2015 | Shigezane et al. | |
| 2014/0124953 A1* | 5/2014 | Jeon .................... | H01L 25/0657 257/774 |

FOREIGN PATENT DOCUMENTS

JP     2012-209497 A    10/2012

* cited by examiner

*Primary Examiner* — Harry W Byrne
*Assistant Examiner* — Lance Reidlinger
(74) *Attorney, Agent, or Firm* — McGinn IP Law Group, PLLC

(57) ABSTRACT

An object of the invention is to make effective use of the structure of a multilayered semiconductor device that uses penetration electrodes in such a manner that the layered chips obtain stable internal power supply voltages with no increase in current consumption or in the area of the layered chips. Internal power supply generation circuits furnished in each of the layered core chips have their outputs commonly coupled via electrodes penetrating the layered core chips. This allows electrical charges to be shared among the core chips, optimizes internal power consumption of the multilayered semiconductor device as a whole, and inhibits fluctuations in the internal power supply voltages.

10 Claims, 11 Drawing Sheets

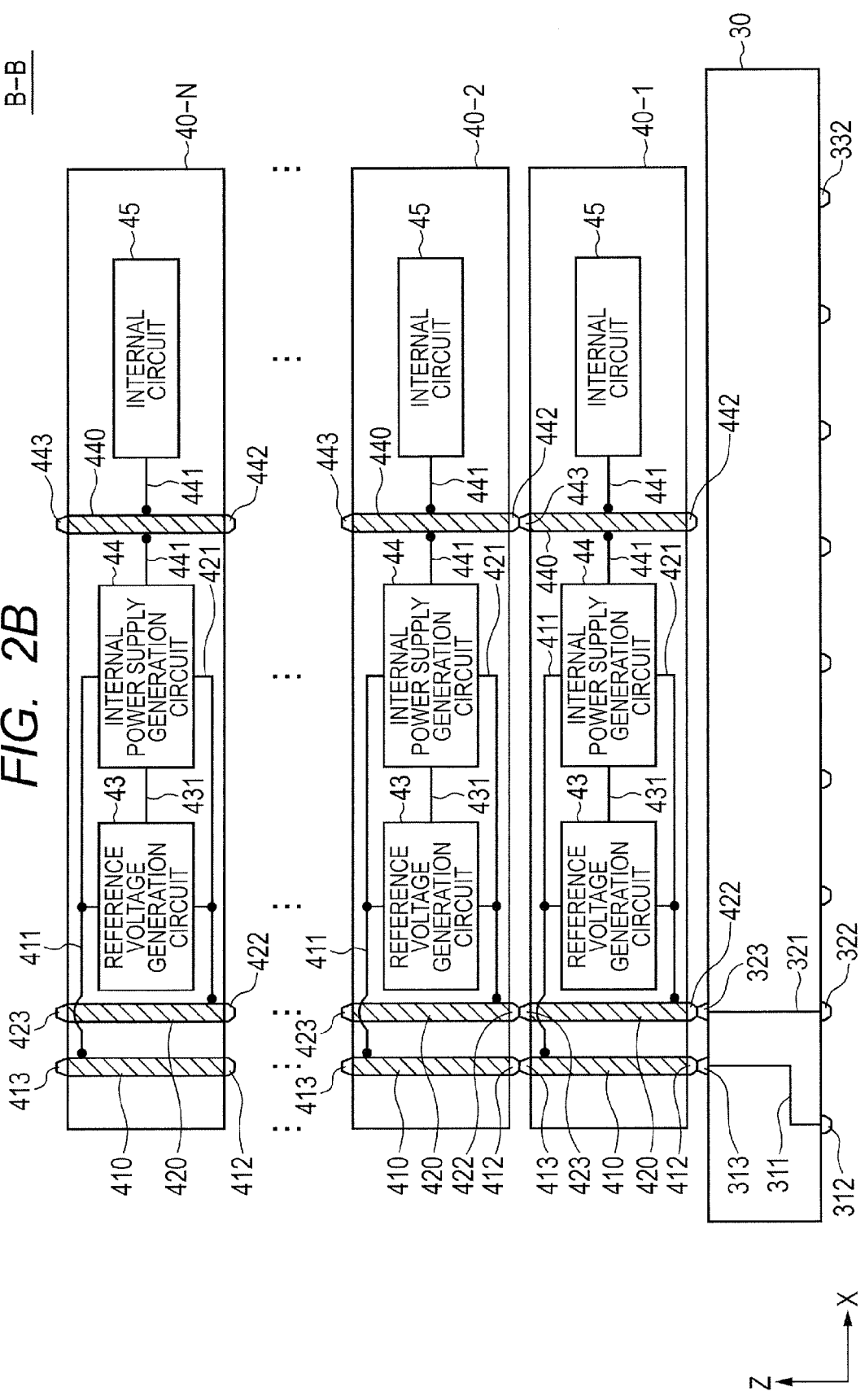

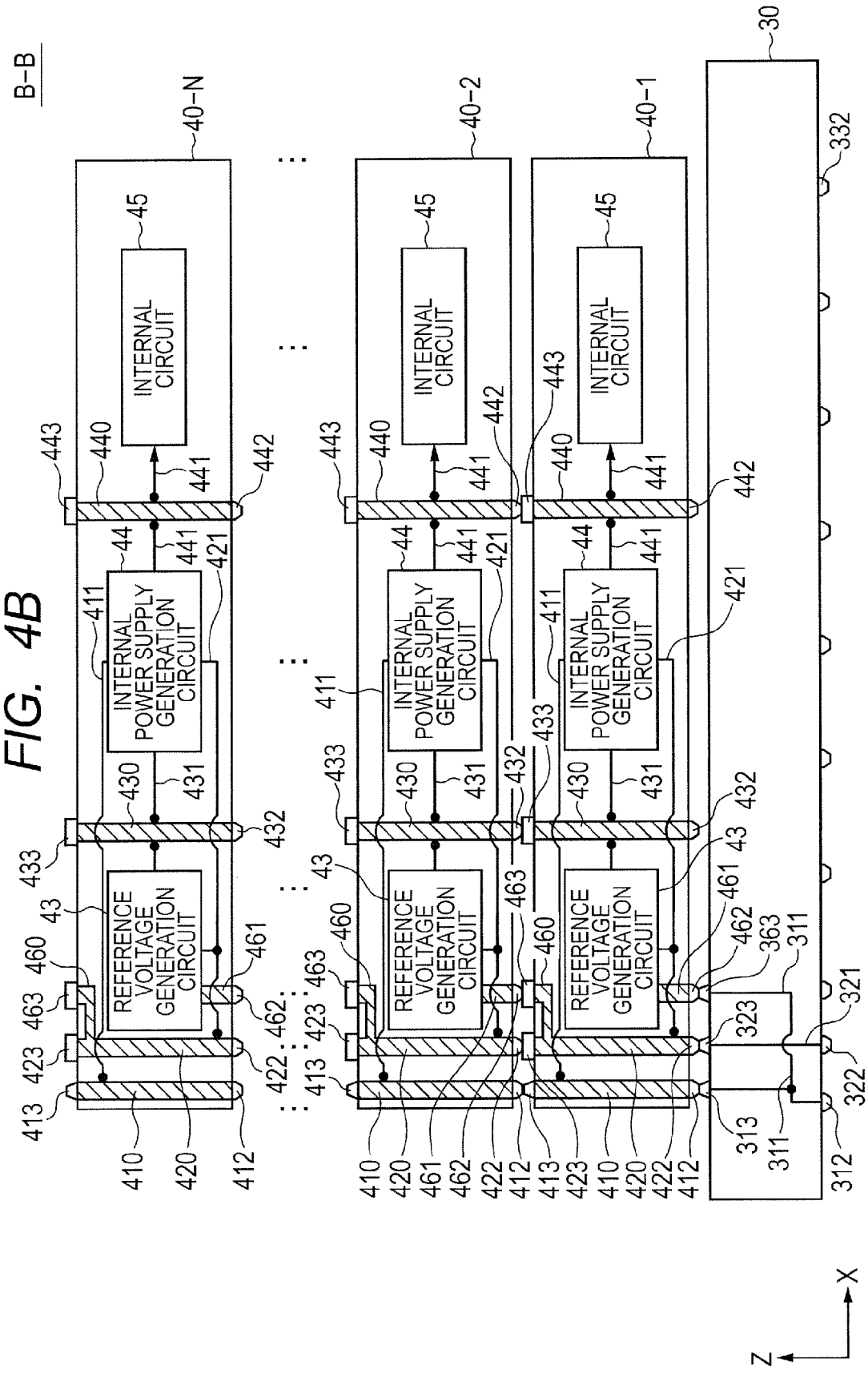

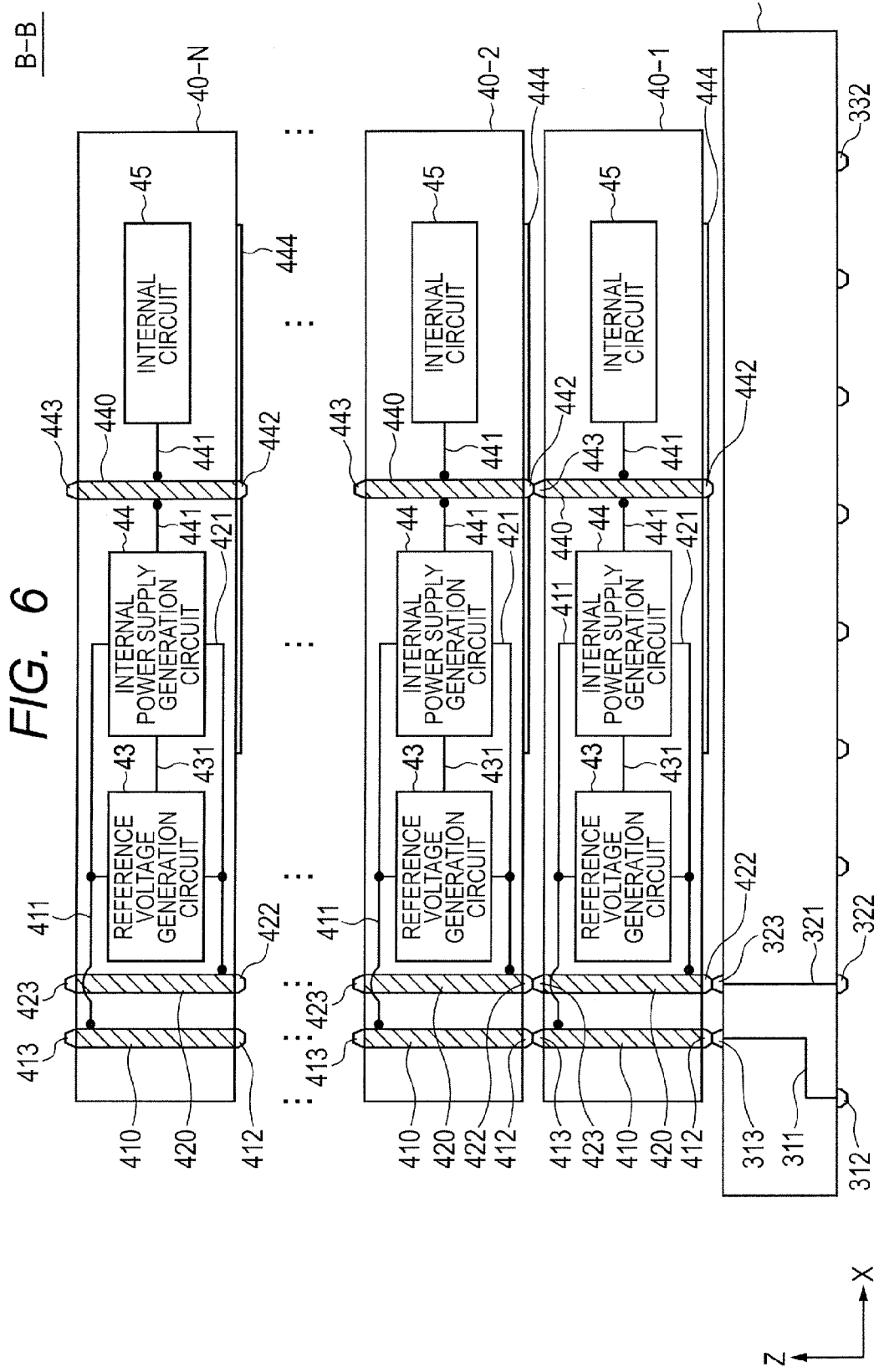

MULTILAYERED SEMICONDUCTOR DEVICE

CROSS-REFERENCE TO RELATED APPLICATIONS

The disclosure of Japanese Patent Application No. 2014-078676 filed on Apr. 7, 2014 including the specification, drawings and abstract is incorporated herein by reference in its entirety.

BACKGROUND

The present invention relates to a multilayered semiconductor device having multiple core chips layered therein. More particularly, the invention is adapted advantageously to a multilayered semiconductor device that incorporates circuits for stably supplying power to internal circuits.

For a semiconductor integrated circuit to operate stably, it is very important to generate stable internal power within its core chips.

Generally, there are two methods by which an internal power supply circuit generates stable power. One method involves increasing the operating current of the power supply circuit so that the latter will improve its response speed. It should be noted that this technique entails an increase in power consumption.

Another method involves arranging compensation capacitance in the semiconductor device to increase the electrical charges to be accumulated in order to inhibit fluctuations in the operating voltage relative to those in the operating current. This technique, it should be noted, entails an increase in the chip area.

To design the internal power supply circuit in a manner minimizing increases in current consumption and in the chip area is a long-standing object to be sought after in designing semiconductor device products.

Meanwhile, there exist techniques for having multiple core chips layered in a single semiconductor device as a method for increasing the scale of an integrated circuit while minimizing the footprint of the semiconductor device.

In relation to the above-mentioned techniques, Japanese Unexamined Patent Application Publication No. 2012-209497 discloses a technique related to a multilayered semiconductor device that uses penetration electrodes. According to the technique disclosed in the above-cited patent literature, the penetration electrodes of interface chips and those of core chips are aligned positionally to eliminate high-resistance wiring in the planar direction. This technique inhibits drops in external supply voltages so that the core chips are fed with stable external supply voltages.

SUMMARY

An object of this invention is to make effective use of the structure of a multilayered semiconductor device that uses penetration electrodes in such a manner that the layered chips obtain stable internal power supply voltages with no increase in current consumption or in the area of the layered chips. Further objects and advantages of the invention will become apparent upon a reading of the ensuing description and appended drawings.

The means for achieving the above objects are summarized below by resorting to some reference numerals used in the ensuing description. Although the reference numerals are added herein to clarify the relations of correspondence between what is claimed by this application and the specific embodiments of the present invention, these numerals should not be construed as limiting the technical scope of the invention stated in the claims.

According one embodiment of the present invention, multiple core chips (40-1 through 40-N) are layered, and internal power supply generation circuits (44) in the respective core chips have their outputs commonly coupled by use of electrodes (440) penetrating these core chips (40-1 through 40-N).

According to the above-mentioned embodiment, it is possible commonly to couple the outputs of the internal power supply generation circuits in the respective core chips via the electrodes penetrating the layered core chips.

BRIEF DESCRIPTION OF THE DRAWINGS

FIG. 2B is a cross-sectional view taken on line B-B in FIG. 2A showing the structure of the multilayered semiconductor device as the first embodiment;

FIG. 4B is a cross-sectional view taken on line B-B in FIG. 4A showing the structure of the multilayered semiconductor device as the third embodiment;

FIG. 6 is a cross-sectional view showing a typical structure of a multilayered semiconductor device as a fifth embodiment of the invention.

DETAILED DESCRIPTION

Some preferred embodiments for implementing the present invention are described below with reference to the accompanying drawings. For a better understanding of these embodiments, a typical structure of a multilayered semiconductor device according to the related art will be first explained as a comparative example.

RELATED ART

Figure 1A:
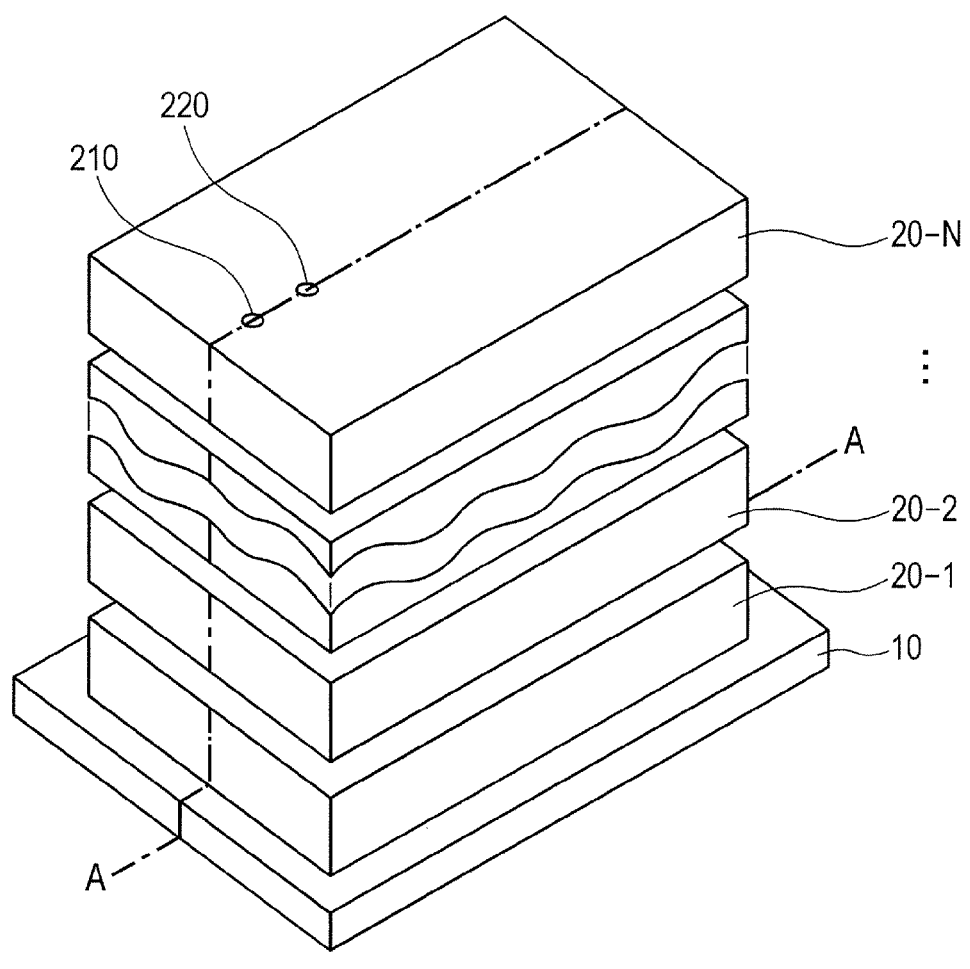
FIG. 1A is a perspective view showing a typical structure of a multilayered semiconductor device according to the related art.
Figure 1B:
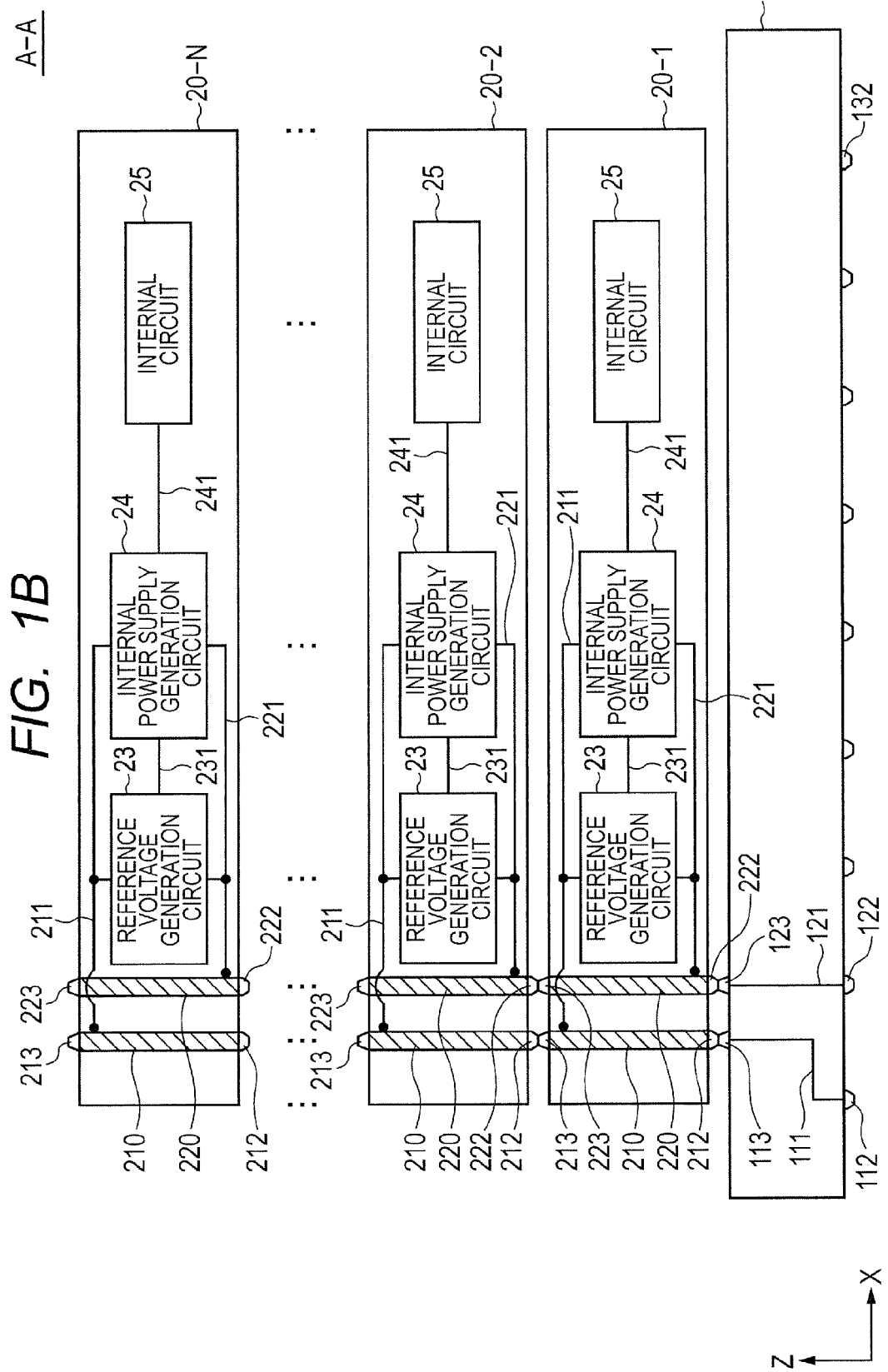
FIG. 1B is a cross-sectional view taken on line A-A in FIG. 1A showing the structure of the multilayered semiconductor device of the related art.

FIG. 1A is a perspective view showing a typical structure of a multilayered semiconductor device according to the related art. FIG. 1B is a cross-sectional view taken on line A-A in FIG. 1A showing the structure of the multilayered semiconductor device of the related art.

The components of the multilayered semiconductor device structured as shown in FIGS. 1A and 1B will now be explained. The multilayered semiconductor device shown in FIG. 1A has a substrate 10, a first core chip 20-1, a second core chip 20-2, ..., and an N-th core chip 20-N. Here, the number N is a predetermined integer equal to the total number of the layered core chips. In the ensuing description, any integer that falls within the range of 1 through N is indicated by "i" so that each of the first core chip 20-1 through the N-th core chip 20-N is denoted as "core chip 20-$i$." All core chips 20-$i$ have the same structure.

The substrate 10 has, over its underside, an external first power supply bump 112, an external second power supply bump 122, and multiple signal bumps 132. The substrate 10 also has, over its upper surface, an external first power supply terminal 113, an external second power supply terminal 123, and multiple signal terminals, not shown. Further, the substrate 10 has an external first power supply line 111, an external second power supply line 121, and multiple signal lines, not shown.

Each core chip 20-$i$ has an external first power supply penetration electrode 210, an external second power supply penetration electrode 220, a reference voltage generation circuit 23, an internal power supply generation circuit 24, an internal circuit 25, an external first power supply line 211, an external second power supply line 221, a reference voltage line 231, and an internal power supply line 241.

In each core chip 20-$i$, the external first power supply penetration electrode 210 has an external first power supply bump 212 arranged over the underside of the core chip 20-$i$ and an external first power supply terminal 213 arranged over the upper surface of the core chip 20-$i$. Likewise, in each core chip 20-$i$, the external second power supply penetration electrode 220 has an external second power supply bump 222 arranged over the underside of the core chip 20-$i$ and an external second power supply terminal 223 arranged over the upper surface of the core chip 20-$i$.

What follows is an explanation of the relation of coupling between the components shown in FIGS. 1A and 1B. The core chips 20-$i$ are layered from the bottom up in ascending order of their branch numbers. An aggregate of the first core chip 20-1 through the N-th core chip 20-N is mounted over the substrate 10. The up-down direction in this context signifies the Z-direction in a coordinate system given in FIGS. 1A and 1B. The Z-direction is perpendicular to the planar direction of the substrate arranged in the X-Y direction of this coordinate system.

With regard to the substrate 10, the external first power supply bump 112 is coupled to the external first power supply terminal 113 via the external first power supply line 111. Likewise, the external second power supply bump 122 is coupled to the external second power supply terminal 123 via the external second power supply line 121.

The external first power supply penetration electrode 210 of the first core chip 20-1 is coupled to the external first power supply terminal 113 of the substrate 10 via the external first power supply bump 212. Likewise, the external second power supply penetration electrode 220 of the first core chip 20-1 is coupled to the external second power supply terminal 123 of the substrate 10 via the external second power supply bump 222.

Also, the external first power supply penetration electrode 210 of the first core chip 20-1 is coupled to the external first power supply penetration electrode 210 of the second core chip 20-2 via the external first power supply terminal 213. Likewise, the external second power supply penetration electrode 220 of the first core chip 20-1 is coupled to the external second power supply penetration electrode 220 of the second core chip 20-2 via the external second power supply terminal 223.

The relation of coupling in the downward direction of the penetration electrodes between the adjacent core chips may be generalized using expressions involving the number "i" between 2 and N inclusive as follows: the external first power supply penetration electrode 210 of the i-th core chip 20-$i$ is coupled to the external first power supply penetration electrode 210 of the (i−1)-th core chip 20-($i$−1) via the external first power supply bump 212. Likewise, the external second power supply penetration electrode 220 of the i-th core chip 20-$i$ is coupled to the external second power supply penetration electrode 220 of the (i−1)-th core chip 20-($i$−1) via the external second power supply bump 222.

Also, the relation of coupling in the upward direction of the penetration electrodes between the adjacent core chips may be generalized using expressions involving the number "i" between 1 and N−1 inclusive as follows: the external first power supply penetration electrode 210 of the i-th core chip 20-$i$ is coupled to the external first power supply penetration electrode 210 of the (i+1)-th core chip 20-($i$+1) via the external first power supply terminal 213. Likewise, the external second power supply penetration electrode 220 of the i-th core chip 20-$i$ is coupled to the external second power supply penetration electrode 220 of the (i+1)-th core chip 20-($i$+1) via the external second power supply terminal 223.

Thus what is important is that the external first power supply bump 212 and external first power supply terminal 213 of the respective core chips 20-$i$ correspond positionally across multiple core chips 20-$i$ being layered. This also applies to the positional relations between the external second power supply bump 222 and the external second power supply terminal 223.

In each core chip 20-$i$, the external first power supply line 211 is coupled to the external first power supply penetration electrode 210, reference voltage generation circuit 23, and internal power supply generation circuit 24. Likewise, the external second power supply line 221 is coupled to the external second power supply penetration electrode 220, reference voltage generation circuit 23, and internal power supply generation circuit 24.

The reference voltage line 231 is coupled to the reference voltage generation circuit 23 and internal power supply generation circuit 24. The internal power supply line 241 is coupled to the internal power supply generation circuit 24 and internal circuit 25.

The workings of the components shown in FIG. 1B are explained below. The external first power supply bump 112 inputs a first power supply voltage from the outside. Likewise, the external second power supply bump 122 inputs a second power supply voltage from the outside. Here, the first power supply voltage may be what is known as the VDD power supply voltage. The second power supply voltage may be so-called grounding.

The external first power supply line 111 and external first power supply terminal 113 transmit an external first power supply voltage to the external first power supply penetration electrode 210 of the first core chip 20-1. Likewise, the external second power supply line 121 and external second power supply terminal 123 transmit an external second power supply voltage to the external second power supply penetration electrode 220 of the first core chip 20-1.

Where the number "i" is any integer between 1 and N−1 inclusive, the external first power supply penetration electrode 210 of the i-th core chip 20-$i$ transmits the external first power supply voltage to the external first power supply penetration electrode 210 of the (i+1)-th core chip 20-(i+1). Likewise, the external second power supply penetration electrode 220 of the i-th core chip 20-i transmits the external second power supply voltage to the external second power supply penetration electrode 220 of the (i+1)-th core chip 20-(i+1).

In each core chip 20-i, the external first power supply line 211 transmits the external first power supply voltage to the reference voltage generation circuit 23 and internal power supply generation circuit 24. Likewise, the external second power supply line 221 transmits the external second power supply voltage to the reference voltage generation circuit 23 and internal power supply generation circuit 24.

In each core chip 20-i, the reference voltage generation circuit 23 generates a reference voltage from the external first and second power supply voltages. Also, the reference voltage line 231 transmits the reference voltage to the internal power supply generation circuit 24.

In each core chip 20-i, the internal power supply generation circuit 24 generates an internal power supply voltage based on the external first power supply voltage, external second power supply voltage, and reference voltage. Also, the internal power supply line 241 transmits the internal power supply voltage to the internal circuit 25.

In each core chip 20-i, the internal circuit 25 performs predetermined operations that may involve the input and output of signals. Such signal input and output may be utilized for conducting communications with an entity outside the multilayered semiconductor device via signal penetration electrodes, not shown, and the signal bumps 132 of the substrate 10.

In the multilayered semiconductor device of the related art shown in FIGS. 1A and 1B, the external first power supply penetration electrode 210 and external second power supply penetration electrode 220 are provided in each core chip 20-i. This structure reduces the scale of the high-resistance wiring in the planar direction needed to transmit the external power supply voltage to each of the configured core chips.

PROBLEMS REMAINING IN THE RELATED ART

Where a stepped-down voltage and a stepped-up voltage for use in the internal circuit are to be generated given an external power supply voltage from the outside, each semiconductor chip is furnished with a step-down circuit and a step-up circuit to generate appropriate internal power supply voltages. Thus the power supply voltage to be stably fed to the semiconductor device is not limited to the external power supply voltage. Feeding the internal power supply voltage stably to the internal circuit that implements the functions of the semiconductor device is as important as stably supplying the external power supply voltage.

Where the appropriate internal power supply voltage is to be supplied stably to the internal circuit for low power consumption, there are problems in terms of responsiveness and compensation capacitance.

First, the typical problem in terms of responsiveness is as follows: when power consumption by the internal circuit fluctuates, there may occur an undershoot or an overshoot of the internal voltage. To suppress the undershoot or overshoot of the internal voltage requires increasing the response speed of a differential comparator that controls the internal voltage by determining whether that the internal voltage is on a required level. However, increasing the response speed of the differential comparator entails raising the power consumption of that comparator, which leads to an increase in the power consumption of the semiconductor device as a whole.

Next, the typical problem in terms of compensation capacitance is as follows: when compensation capacitance is provided in the semiconductor device, fluctuations in the internal voltage per unit time can be reduced. As a result, divergences due to an undershoot or an overshoot of the internal voltage from the required voltage level can be suppressed. However, adding further compensation capacitance to inhibit the fluctuations in the internal voltage will increase the chip area of the semiconductor device correspondingly, which leads to cost rises.

First Embodiment

Figure 2A:
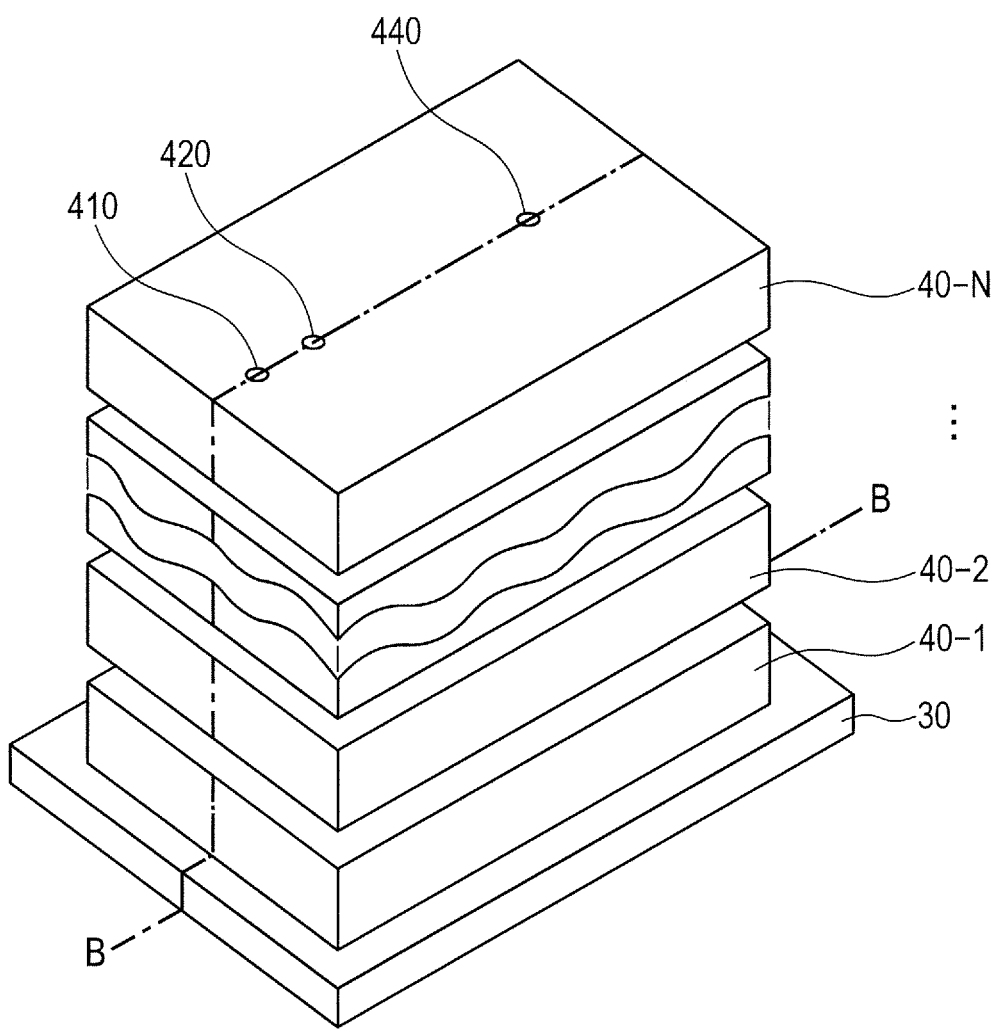
FIG. 2A is a perspective view showing a typical structure of a multilayered semiconductor device as a first embodiment of the invention.

FIG. 2A is a perspective view showing a typical structure of a multilayered semiconductor device as the first embodiment of the invention. FIG. 2B is a cross-sectional view taken on line B-B in FIG. 2A showing the structure of the multilayered semiconductor device as the first embodiment.

The typical structure of the multilayered semiconductor device shown in FIGS. 2A and 2B will now be explained. The multilayered semiconductor device shown in FIG. 2A has a substrate 30, a first core chip 40-1, a second core chip 40-2, ..., and an N-th core chip 40-N. Here, as with the related art discussed above, the number N is a predetermined integer equal to the total number of the multilayered core chips. And the integer "i" that falls within the range of 1 through N will be used in the ensuing description in the same manner as in the above-described related art. Although all core chips 40-i should preferably have the same structure, some or all of the core chips are allowed to have a partially different structure.

The substrate 30 has, over its underside, an external first power supply bump 312, an external second power supply bump 322, and multiple signal bumps 332. The substrate 30 also has, over its upper surface, an external first power supply terminal 313, an external second power supply terminal 323, and multiple signal terminals, not shown. Further, the substrate 30 has an external first power supply line 311, an external second power supply line 321, and multiple signal lines, not shown. Alternatively, the substrate 30 may be an interposer that has multiple core chips mounted over a flat surface.

Each core chip 40-i has an external first power supply penetration electrode 410, an external second power supply penetration electrode 420, an internal power supply penetration electrode 440, a reference voltage generation circuit 43, an internal power supply generation circuit 44, an internal circuit 45, an external first power supply line 411, an external second power supply line 421, a reference voltage line 431, and an internal power supply line 441.

In each core chip 40-i, the external first power supply penetration electrode 410 has an external first power supply bump 412 arranged over the underside of the core chip 40-i and an external first power supply terminal 413 arranged over the upper surface of the core chip 40-i. Likewise, the external second power supply penetration electrode 420 has an external second power supply bump 422 arranged over the underside of the core chip 40-i and an external second power supply terminal 423 arranged over the upper surface of the core chip 40-i. The internal power supply penetration electrode 440 has an internal power supply bump 442 arranged over the underside of the core chip 40-i and an internal power supply terminal 443 arranged over the upper surface of the core chip 40-i.

In other words, the multilayered semiconductor device as the first embodiment shown in FIGS. 2A and 2B is different from the multilayered semiconductor device of the related art in FIGS. 1A and 1B in the following points:

First, the multilayered semiconductor device shown in FIGS. 2A and 2B has the internal power supply penetration electrode 440 provided in each core chip 40-*i*.

Next, the internal power supply line 441 is also coupled to the internal power supply penetration electrode 440.

Further, the relation of coupling in the downward direction of the internal power supply penetration electrodes 440 between the adjacent core chips may be generalized using expressions involving the number "i" between 2 and N inclusive as follows: the internal power supply penetration electrode 440 of the i-th core chip 40-*i* is coupled to the internal power supply penetration electrode 440 of the (i−1)-th core chip 40-(*i*−1) via the internal power supply bump 442.

Also, the relation of coupling in the upward direction of the internal power supply penetration electrodes 440 between the adjacent core chips may be generalized using expressions involving the number "i" between 1 and N−1 inclusive as follows: the internal power supply penetration electrode 440 of the i-th core chip 40-*i* is coupled to the internal power supply penetration electrode 440 of the (i+1)-th core chip 40-(*i*+1) via the internal power supply terminal 443.

Thus what is important is that the internal power supply bump 442 and internal power supply terminal 443 of each core chip 40-*i* correspond positionally across multiple core chips 40-*i* being layered. This also applies to the positional relations between the external first power supply bump 412 and the external first power supply terminal 413, as well as between the external second power supply bump 422 and the external second power supply terminal 423.

Although FIGS. 2A and 2B show a configuration example in which each core chip 40-*i* has one internal power supply generation circuit 44 and one internal power supply penetration electrode 440, the number of configured components is only an example and not limitative of this embodiment. Alternatively, each core chip 40-*i* may have multiple internal power supply generation circuits 44 and multiple internal power supply penetration electrodes 440. As another alternative, the number of internal power supply generation circuits 44 may be different from the number of internal power supply penetration electrodes 440 in each of the configured core chips 40-*i*.

Meanwhile, the other components included in the multilayered semiconductor device as the first embodiment shown in FIGS. 2A and 2B have the relation of correspondence with the components of the related art indicated in FIGS. 1A and 1B as explained below. The corresponding components have like structures, like relations of connection, and like functions.

First, the substrate 30 of the first embodiment corresponds to the substrate 10 of the related art. The external first power supply bump 312, external first power supply line 311, and external first power supply terminal 313 of the first embodiment correspond respectively to the external first power supply bump 112, external first power supply line 111, and external first power supply terminal 113 of the related art. The external second power supply bump 322, external second power supply line 321, and external second power supply terminal 323 of the first embodiment correspond respectively to the external second power supply bump 122, external second power supply line 121, and external second power supply terminal 123 of the related art.

Next, each core chip 40-*i* of the first embodiment corresponds structurally to each core chip 20-*i* of the related art except for the structures of the internal power supply penetration electrode 440 and internal power supply line 441.

The reference voltage generation circuit 43 and reference voltage line 431 of the first embodiment correspond respectively to the reference voltage generation circuit 23 and reference voltage line 231 of the related art. The internal power supply generation circuit 44 and internal circuit 45 of the first embodiment correspond respectively to the internal power supply generation circuit 24 and internal circuit 25 of the related art.

The external first power supply penetration electrode 410, external first power supply bump 412, external first power supply terminal 413, and external first power supply line 411 of the first embodiment correspond respectively to the external first power supply penetration electrode 210, external first power supply bump 212, external first power supply terminal 213, and external first power supply line 211 of the related art. The external second power supply penetration electrode 420, external second power supply bump 422, external second power supply terminal 423, and external second power supply line 421 of the first embodiment correspond respectively to the external second power supply penetration electrode 220, external second power supply bump 222, external second power supply terminal 223, and external second power supply line 221 of the related art.

The components of the first embodiment involving the above-described corresponding relations have the structures, relations of connection, and functions similar to those of the corresponding components of the related art and thus will not be discussed further in detail.

In the first core chip 40-1 positioned in the bottom layer, the external first power supply bump 412 and external second power supply bump 422 are coupled respectively to the external first power supply terminal 313 and external second power supply terminal 323 arranged over the upper surface of the substrate 30. However, the internal power supply bump 442 arranged over the underside of the first core chip 40-1 is not coupled to any of the terminals furnished over the substrate 30. In other words, the internal power supply bump 442 is insulated electrically from the substrate 30. For this reason, there is no need to furnish any terminal at the position over the upper surface of the substrate 30 corresponding to the internal power supply bump 442 of the first core chip 40-1.

The workings of the internal power supply penetration electrode 440 and internal power supply line 441 of the first embodiment will now be explained. The internal power supply line 441 is coupled to the output of the internal power supply generation circuit 44, to the internal power supply penetration electrode 440, and to the input of the internal circuit 45. Also, the internal power supply line 441 transmits the internal power supply voltage output from the internal power supply generation circuit 44 to the internal power supply penetration electrode 440 and internal circuit 45. The internal power supply penetration electrodes 440 couple commonly the outputs of the internal power supply generation circuits 44 in the multilayered core chips 40-*i*, so that their electrical charges are shared. As a result, the internal power consumption of the multilayered semiconductor device as a whole is optimized in a manner inhibiting the fluctuations in the internal power supply voltages.

According to the multilayered semiconductor device as the first embodiment described above, the total volume of the compensation capacitance possessed by the multiple core chips 40-*i* is made visible at the outputs of the respective internal power supply generation circuits 44, so that the fluctuations in the internal power supply voltages can be suppressed. Also, because the total volume of the compensation capacitance possessed by the multiple core chips is made visible, it is possible to make the compensation capacitance in each of the configured core chips smaller in volume than the compensation capacitance needed to operate a core chip alone, thereby suppressing the increase in the chip area as well. Because the fluctuations in the internal power supply voltages are inhibited using the compensation capacitance, there is less or no need for boosting the speed of the internal power supply generation circuit 44. This contributes to reducing the current consumption of the multilayered semiconductor device as a whole.

Explained next is a more specific example in which the internal circuit 45 of each core chip 40-$i$ functions as a storage circuit so that the multilayered semiconductor device as a whole functions as a bank-switched memory device.

Figure 2C:
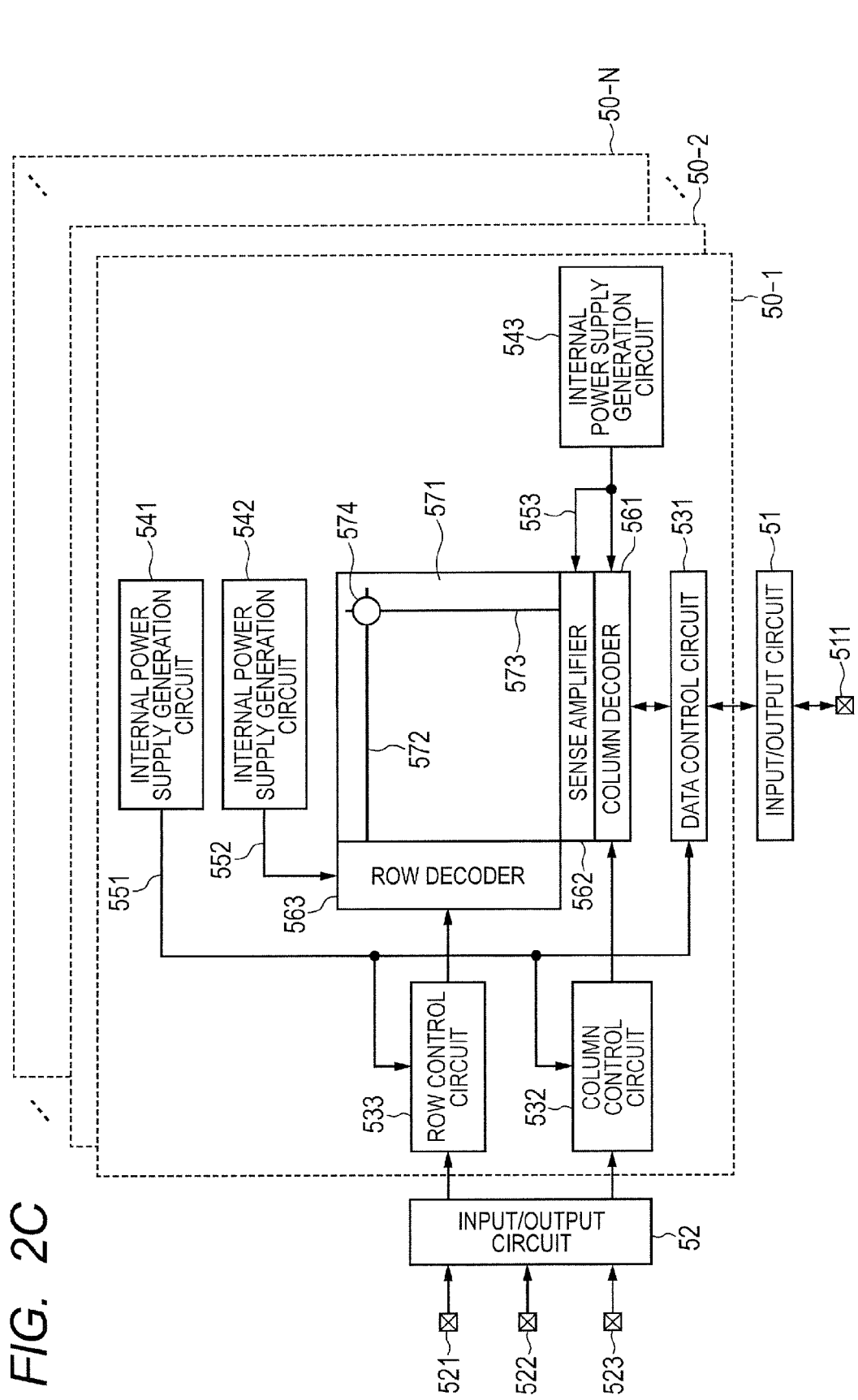
FIG. 2C is a block circuit diagram showing a typical structure of the multilayered semiconductor device as the first embodiment.

FIG. 2C is a block circuit diagram showing a typical structure of the multilayered semiconductor device as the first embodiment. The components of the typical structure in the block circuit diagram shown in FIG. 2C are explained below.

The block circuit diagram of FIG. 2C includes a first bank 50-1, a second bank 50-2, ..., and an N-th bank 50-N. These banks 50-$i$ correspond to the multiple core chips 40-$i$ respectively.

Each bank 50-$i$ includes a data control circuit 531, a column control circuit 532, a row control circuit 533, a first internal power supply generation circuit 541 through a third internal power supply generation circuit 543, a first internal power supply line 551 through a third internal power supply line 553, a column decoder 561, a sense amplifier 562, a row decoder 563, and a memory cell array 571.

The memory cell array 571 has multiple word lines 572, multiple bit lines 573, and multiple memory cells 574.

The block circuit diagram shown in FIG. 2C further includes a first input/output circuit 51, a data input/output terminal 511, a second input/output circuit 52, a row address input/output terminal 521, a clock input/output terminal 522, and a column address input/output terminal 523. These components may be furnished in each core chip 40-$i$ or provided over the substrate 30.

What follows is an explanation of the relation of coupling between the components shown in FIG. 2C. The input/output terminal 511 is coupled to the first input/output circuit 51. The first input/output circuit 51 is commonly coupled to the data control circuits 531 possessed by the configured core chips 40-$i$. The data control circuit 531 is coupled to the column decoder 561. The column decoder 561 is coupled to the bit lines 573 of the memory cell array 571 via the sense amplifier 562.

The row address input/output terminal 521, clock input/output terminal 522, and column address input/output terminal 523 are coupled to the second input/output circuit 52. The second input/output circuit 52 is coupled to the column control circuit 532 and row control circuit 533. The column control circuit 532 is coupled to the column decoder 561. The row control circuit 533 is coupled to the row decoder 563. The row decoder is coupled to the word lines 572 of the memory cell array 571.

In the memory cell array 571, multiple memory cells 574 are arranged at all points of intersection between the multiple word lines 572 and the multiple bit lines 573.

The first internal power supply generation circuit 541 supplies a first internal power supply voltage to the data control circuit 531, column control circuit 532, and row control circuit 533 via the first internal power supply line 551. The second internal power supply generation circuit 542 supplies a second internal power supply voltage to the row decoder 563 via the second internal power supply line 552. The third internal power supply generation circuit 543 supplies a third internal power supply voltage to the column decoder 561 and sense amplifier 562 via the third internal power supply line 553.

In the typical structure shown in FIG. 2C, the external first power supply voltage and external second power supply voltage are supplied to the input/output circuits 51 and 52 via power supply input terminals, not shown.

In the typical structure shown in FIG. 2C, the multiple internal power supply generation circuits furnished in each of the core chips 40-$i$ supply different internal power supply voltages to different circuit parts included in the internal circuit 45. The outputs of the multiple internal power supply generation circuits are coupled respectively to the outputs of the multiple internal power supply generation circuits of the other core chips 40-$i$ via multiple internal power supply penetration electrodes, not shown.

An operation example of the multilayered semiconductor device as the first embodiment having the typical structure shown in FIG. 2C will now be explained. In the typical structure of FIG. 2C, the multilayered semiconductor device functions as a bank-switched storage device. The functionality of memory devices centering on the memory cell array 571 is a known technique and thus will not be discussed further. In the bank-switched storage device, the same memory address space is shared by multiple memory devices, so that that basically one bank 50-$i$ alone operates at any given time while the other banks 50-$i$ remain idle during that time. Thus when the outputs of the multiple internal power supply generation circuits 44 are commonly coupled via the internal power supply penetration electrodes 440 spanning the multiple core chips 40-$i$, it is possible to share electrical charges between the multiple core chips 40-$i$, to optimize the internal power consumption of the multilayered semiconductor device as a whole, and to suppress the fluctuations in the respective internal power supply voltages.

Another operation example of the multilayered semiconductor device as the first embodiment having the typical structure shown in FIG. 2C will now be explained. In this operation example, the multilayered semiconductor device having the structure shown in FIG. 2C functions as a bank-switched storage device that is faster than in the preceding operation example. In many cases, the input/output circuits such as the first and second input/output circuits 51 and 52 can operate faster than the memory cell array 571. Thus when the operations of the banks 50-$i$ are slightly staggered, both the memory cell array 571 and the input/output circuits 51 and 52 can operate at the highest possible speed. In such a case, the timings of power consumption by each of the banks 50-$i$ generating currents differ from one another, so that the first embodiment still turns out to be advantageous.

In the case of memory devices operating on principles other than bank switching, i.e., where all internal circuits 45 operate at the same time, there is a low possibility that signal changes are the same in all internal circuits of the different banks, with current consumption varying from one bank to another. Thus when the volume of the compensation capacitance in the internal power supply generation circuits of the core chips having low current consumption and the volume of the compensation capacitance possessed by the core chips corresponding to the banks are all made visible, it is possible to compensate for the fluctuations in the internal power supply voltages of the core chips having high current consumption. As a result, the internal power supply voltages can be supplied stably. The diversity in this respect of the internal circuit 45 in each core chip 40-$i$ is also considered effective for devices other than the memory devices. Thus the same advantages as those of the bank-switched storage device can also be obtained in this case, despite the difference in scale.

Second Embodiment

Figure 3A:
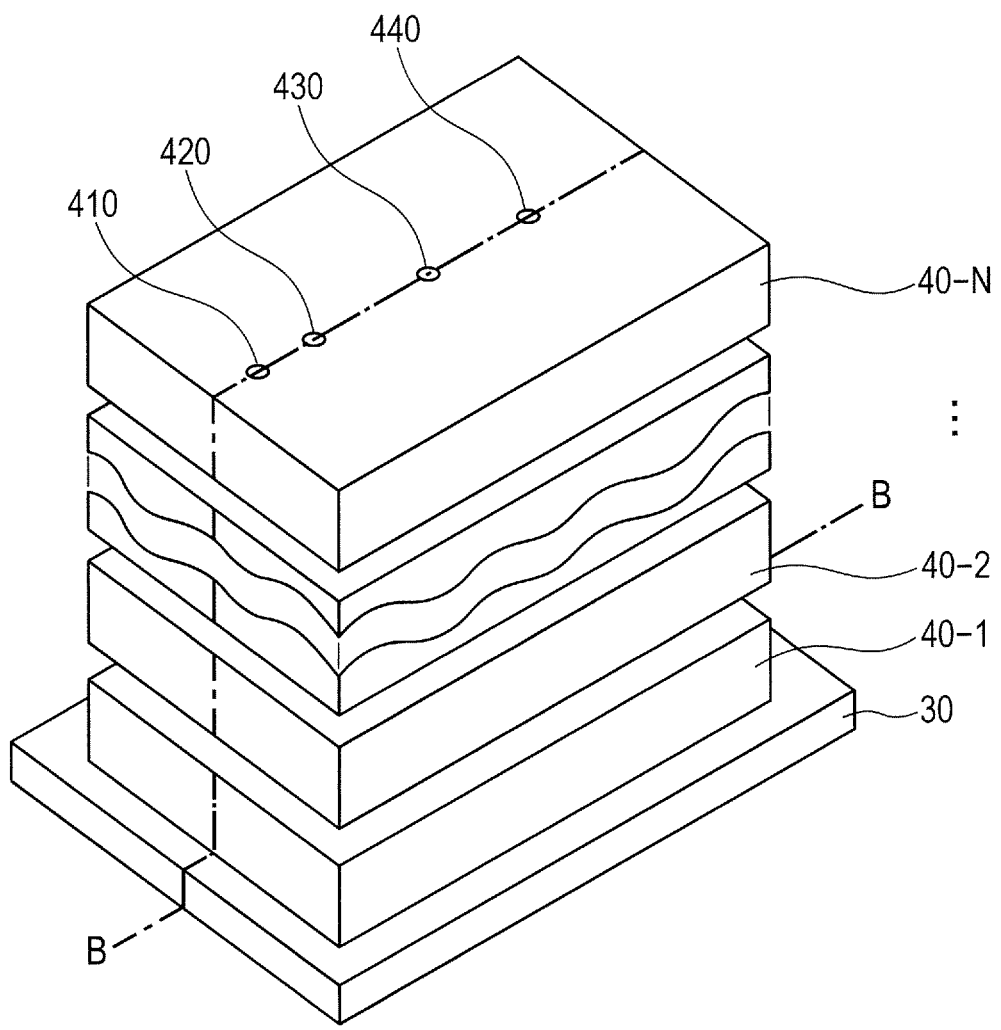
FIG. 3A is a perspective view showing a typical structure of a multilayered semiconductor device as a second embodiment of the invention.
Figure 3B:
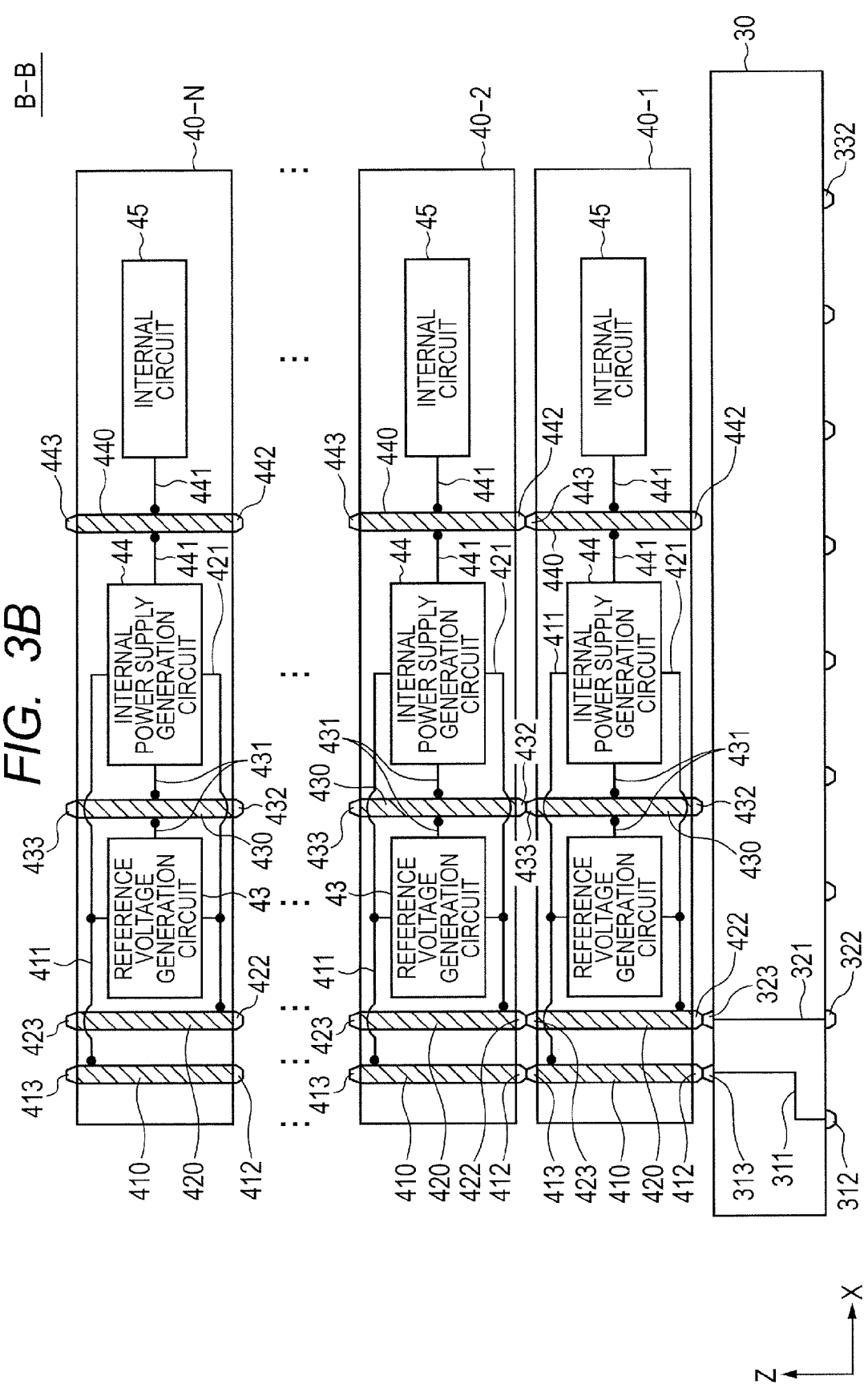
FIG. 3B is a cross-sectional view taken on line B-B in FIG. 3A showing the structure of the multilayered semiconductor device as the second embodiment.

FIG. 3A is a perspective view showing a typical structure of a multilayered semiconductor device as the second embodiment of the invention. FIG. 3B is a cross-sectional view taken on line B-B in FIG. 3A showing the structure of the multilayered semiconductor device as the second embodiment.

The structure of the multilayered semiconductor device as the second embodiment shown in FIGS. 3A and 3B will now be explained. The multilayered semiconductor device as the second embodiment is equivalent to the multilayered semiconductor device as the first embodiment in FIGS. 2A and 2B except for one alteration: the addition of a reference voltage penetration electrode 430 to each core chip 40-$i$.

In each core chip 40-$i$, the reference voltage penetration electrode 430 has a reference voltage bump 432 arranged over the underside of the core chip 40-$i$ and a reference voltage terminal 433 arranged over the upper surface of the core chip 40-$i$. And in each core chip 40-$i$, the reference voltage penetration electrode 430 is coupled to the reference voltage line 431.

Further, the relation of coupling in the downward direction of the reference voltage penetration electrodes 430 between the adjacent core chips may be generalized using expressions involving the number "i" between 2 and N inclusive as follows: the reference voltage penetration electrode 430 of the i-th core chip 40-$i$ is coupled to the reference voltage penetration electrode 430 of the (i−1)-th core chip 40-($i$−1) via the reference voltage bump 432.

Also, the relation of coupling in the upward direction of the reference voltage penetration electrodes 430 between the adjacent core chips may be generalized using expressions involving the number "i" between 1 and N−1 inclusive as follows: the reference voltage penetration electrode 430 of the i-th core chip 40-$i$ is coupled to the reference voltage penetration electrode 430 of the (i+1)-th core chip 40-($i$+1) via the reference voltage terminal 433.

Thus what is important is that the reference voltage bump 432 and reference voltage terminal 433 of each core chip 40-$i$ correspond positionally across multiple core chips 40-$i$ being layered. This also applies to the positional relations between the external first power supply bump 412 and the external first power supply terminal 413, between the external second power supply bump 422 and the external second power supply terminal 423, and between the internal power supply bump 442 and the internal power supply terminal 443.

The structures, relations of connection, and operations of the other components shown in FIGS. 3A and 3B are the same as those of the first embodiment indicated in FIGS. 2A and 2B and thus will not be discussed further in detail.

In the second embodiment, as in the first embodiment, the internal power supply bump 442 arranged over the underside of the first core chip 40-1 is not coupled to any of the terminals provided over the substrate 30. In other words, the internal power supply bump 442 is insulated electrically from the substrate 30. For this reason, there is no need to furnish any terminal at the position over the upper surface of the substrate 30 corresponding to the internal power supply bump 442 of the first core chip 40-1.

The workings of the reference voltage penetration electrode 430 in the second embodiment shown in FIGS. 3A and 3B will now be explained. The reference voltage line 431 transmits the reference voltage output from the reference voltage generation circuit 43 to the reference voltage penetration electrode 430 and internal power supply generation circuit 44. The reference voltage penetration electrodes 430 couple commonly the outputs of the reference voltage generation circuits 43 between the multilayered core chips 40-$i$, so that the reference voltages are equalized across all configured core chips 40-$i$.

In the second embodiment, the outputs of the reference voltage generation circuits 43 are coupled via the reference voltage penetration electrodes 430 spanning the multiple core chips 40-$i$. This makes it possible to suppress any divergence that may occur from the reference voltage across the core chips 40-$i$.

Third Embodiment

Figure 4A:
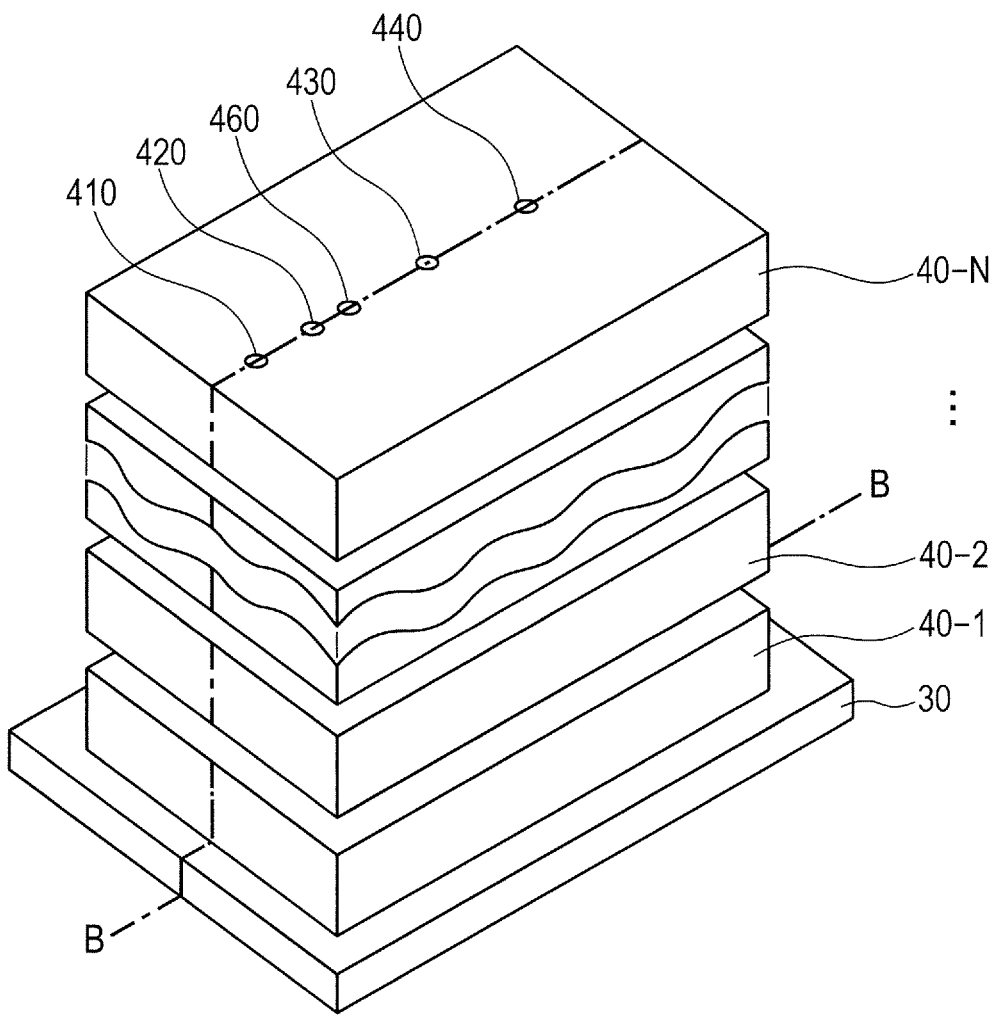
FIG. 4A is a perspective view showing a typical structure of a multilayered semiconductor device as a third embodiment of the invention.

FIG. 4A is a perspective view showing a typical structure of a multilayered semiconductor device as the third embodiment of the invention. FIG. 4B is a cross-sectional view taken on line B-B in FIG. 4A showing the structure of the multilayered semiconductor device as the third embodiment.

The multilayered semiconductor device as the third embodiment shown in FIGS. 4A and 4B is equivalent to the multilayered semiconductor device as the second embodiment in FIGS. 3A and 3B except for the following alterations:

First, the substrate 30 further has an external third power supply terminal 363 arranged over its upper surface. The external first power supply bump 312 arranged over the underside of the substrate 30 is coupled to the external third power supply terminal 363 via the external first power supply line 311.

Next, each core chip 40-$i$ further includes an external third power supply upper-side electrode 460 and an external third power supply underside electrode 461. And in each core chip 40-$i$, the reference voltage generation circuit 43 is insulated from the external first power supply penetration electrode 410 and external first power supply line 411. Here, the external third power supply upper-side electrode 460 has an external third power supply terminal 463 arranged over the upper surface of the core chip 40-$i$ and is coupled to the external second power supply penetration electrode 420. The external third power supply underside electrode 461 has an external third power supply bump 462 arranged over the underside of the core chip 40-$i$ and is coupled to the reference voltage generation circuit 43.

Further, the relation of coupling in the downward direction of the external third power supply underside electrodes 461 between the adjacent core chips may be generalized using expressions involving the number "i" between 2 and N inclusive as follows: the external third power supply underside electrode 461 of the i-th core chip 40-$i$ is coupled to the external third power supply upper-side electrode 460 of the (i−1)-th core chip 40-($i$−1) via the external third power supply bump 462.

Also, the relation of coupling in the upward direction of the external third power supply upper-side electrodes 460 between the adjacent core chips may be generalized using expressions involving the number "i" between 1 and N−1 inclusive as follows: the external third power supply upper-side electrode 460 of the i-th core chip 40-$i$ is coupled to the external third power supply underside electrode 461 of the (i+1)-th core chip 40-($i$+1) via the external third power supply terminal 463.

Thus what is important is that the external third power supply bump 462 and external third power supply terminal 463 of each core chip 40-$i$ correspond positionally across multiple core chips 40-$i$ being layered. This also applies to the positional relations between the external first power supply bump 412 and the external first power supply terminal 413, between the external second power supply bump 422 and the external second power supply terminal 423, between the internal power supply bump 442 and the internal power supply terminal 443, and between the reference voltage bump 432 and the reference voltage terminal 433.

The workings of the multilayered semiconductor device as the third embodiment shown in FIGS. 4A and 4B are explained below.

First, the substrate 30 supplies an external first voltage to the external third power supply bump 462 of the first core chip 40-1 via the external first power supply ump 312, external first power supply line 311, and external third power supply terminal 363. Also, the substrate 30 supplies an external second voltage to the external second power supply bump 422 of the first core chip 40-1 via the external second power supply bump 322, external second power supply line 321, and external second power supply terminal 323.

Next, the first core chip 40-1 supplies the external first voltage fed from the external third power supply bump 462 to the reference voltage generation circuit 43 via the external third power supply underside electrode 461. The first core chip 40-1 supplies the external second voltage fed from the external second power supply bump 422 to the reference voltage generation circuit 43 via the external second power supply penetration electrode 420 and external second power supply line 421. The first core chip 40-1 transmits the external second voltage fed from the external second power supply bump 422 to the external second power supply bump 422 of the second core chip 40-2 via the external second power supply penetration electrode 420 and external second power supply terminal 423. The first core chip 40-1 transmits the external second voltage fed from the external second power supply bump 422 to the external third power supply bump 462 of the second core chip 40-2 via the external second power supply penetration electrode 420, external third power supply upper-side electrode 460, and external third power supply terminal 463.

Also, power transmission in the upward direction involving the external third power supply upper-side electrodes 460 and the external third power supply underside electrodes 461 between the adjacent core chips may be generalized using expressions involving the number "i" between 1 and N−1 inclusive as follows: the external third power supply upper-side electrode 460 of the i-th core chip 40-$i$ transmits power to the external third power supply underside electrode 461 of the (i+1)-th core chip 40-(i+1) via the external third power supply terminal 463.

Here, only the reference voltage generation circuit 43 of the first core chip 40-1 is supplied with the external first and second voltages, so that the circuit 43 operates normally to generate the reference voltage as in the second embodiment. On the other hand, the reference voltage generation circuit 43 in each of the second core chip 40-2 through the N-th core chip 40-N is supplied solely with the external second voltage coupled to ground. Thus these reference voltage generation circuits 43 do not operate in practice and do not generate the reference voltage. However, the internal power supply generation circuit 44 in every core chip 40-$i$ is fed with the reference voltage generated by the first core chip 40-1 by way of the reference voltage penetration electrode 430 furnished in every core chip 40-$i$. These internal power supply generation circuits 44 then operate normally as in the second embodiment.

The structures, relations of connection, and operations of the other components of the multilayered semiconductor device as the third embodiment shown in FIGS. 4A and 4B are the same as those of the second embodiment indicated in FIGS. 3A and 3B and thus will not be discussed further in detail.

In the third embodiment, as in the first embodiment, the internal power supply bump 442 arranged over the underside of the first core chip 40-1 is not coupled to any of the terminals provided over the substrate 30. In other words, the internal power supply bump 442 is insulated electrically from the substrate 30. For this reason, there is no need to furnish any terminal at the position over the upper surface of the substrate 30 corresponding to the internal power supply bump 442 of the first core chip 40-1.

According to the multilayered semiconductor device as the third embodiment, the advantages provided by the second embodiment are supplemented with a further advantage: because only one of the multiple reference voltage generation circuits 43 configured operates at any one time while the rest remain idle, the current consumption of the semiconductor device can be reduced correspondingly. Also in the third embodiment, all internal power supply generation circuits 44 are supplied with the same reference voltage when operating, so that the fluctuations in the internal voltages generated by the individual core chips 40-$i$ can be expected to be reduced.

Fourth Embodiment

Figure 5:
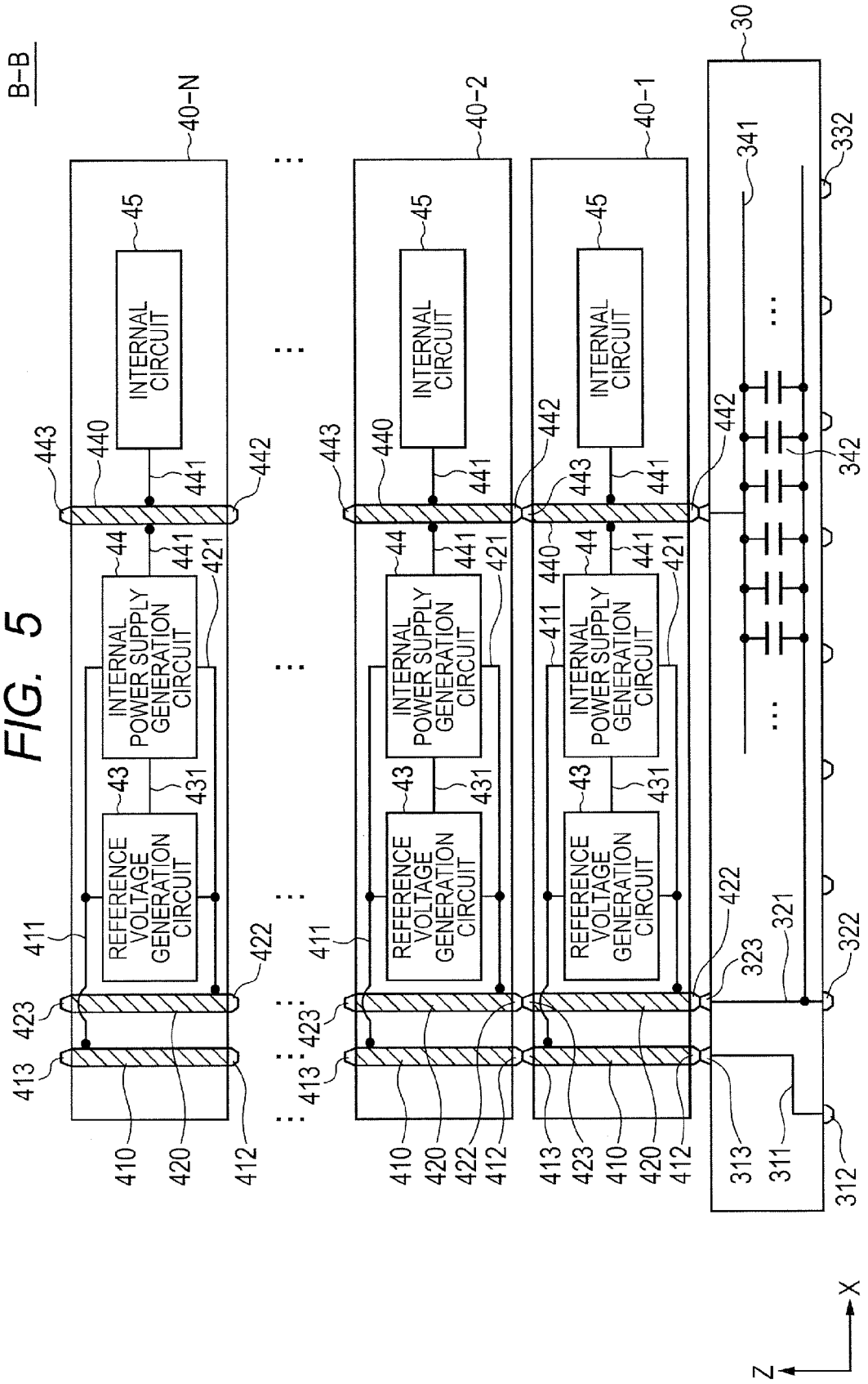
FIG. 5 is a cross-sectional view showing a typical structure of a multilayered semiconductor device as a fourth embodiment of the invention.

FIG. 5 is a cross-sectional view showing a typical structure of a multilayered semiconductor device as the fourth embodiment of the invention. The perspective view of the multilayered semiconductor device of which the typical structure is shown in FIG. 5 is the same as that of the first embodiment in FIG. 2A and is thus omitted here.

The multilayered semiconductor device as the fourth embodiment shown in FIG. 5 is equivalent to the multilayered semiconductor device as the first embodiment in FIG. 2B except for the following alterations:

The substrate 30 is furnished with a capacitance 342. The capacitance 342 may be provided as a group of capacitative elements coupled in parallel or in series. One end of the capacitance 342 is coupled to the internal power supply bump 442 arranged over the underside of the first core chip 40-1, and the other end of the capacitance 342 is coupled to the external second power supply line 321 coupled to ground.

The structures, relations of connection, and operations of the other components of the multilayered semiconductor device as the fourth embodiment shown in FIG. 5 are the same as those of the first embodiment indicated in FIG. 2B and thus will not be discussed further in detail.

According to the multilayered semiconductor device as the fourth embodiment shown in FIG. 5, the capacitance 342 in the substrate 30 functions as compensation capacitance when viewed from the output of the internal power supply generation circuit 44. This provides the benefit of suppressing the fluctuations in the internal power supply voltage without increasing the chip size.

Fifth Embodiment

FIG. 6 is a cross-sectional view showing a typical structure of a multilayered semiconductor device as the fifth embodiment of the invention. The perspective view of the multilayered semiconductor device of which the typical structure is shown in FIG. 6 is the same as that of the first embodiment in FIG. 2A and is thus omitted here.

The multilayered semiconductor device as the fifth embodiment shown in FIG. 6 is equivalent to the multilayered semiconductor device as the first embodiment in FIG. 2B except for the following alterations:

Over the underside of each core chip 40-$i$, a metal layer 444 is arranged in the planar direction. In each core chip 40-$i$, the metal layer 444 is coupled to the output of the internal power supply generation circuit 44 via the internal power supply line 441, internal power supply penetration electrode 440, and internal power supply bump 442, among others.

The location in which to arrange the metal layer 444 is not limited to the underside of the core chip 40-*i*; the metal layer 444 may alternatively be located over the upper surface of the core chip 40-*i* or over both the underside and the upper surface thereof. Preferably, the metal layer 444 should be formed in terms of location and shape in such a manner as to avoid interference with the external first power supply penetration electrode 410, external second power supply penetration electrode 420, other penetration electrodes, and signal penetration electrodes, not shown.

The structures, relations of connection, and operations of the other components of the multilayered semiconductor device as the fifth embodiment shown in FIG. 6 are the same as those of the first embodiment indicated in FIG. 2B and thus will not be discussed further in detail.

In the fifth embodiment, as in the first embodiment, the internal power supply bump 442 arranged over the underside of the first core chip 40-1 is not coupled to any of the terminals provided over the substrate 30. In other words, the internal power supply bump 442 is insulated electrically from the substrate 30. For this reason, there is no need to furnish any terminal at the position over the upper surface of the substrate 30 corresponding to the internal power supply bump 442 of the first core chip 40-1.

According to the multilayered semiconductor device as the fifth embodiment shown in FIG. 6, the metal layer 444 functions as the compensation capacitance when viewed from the output of the internal power supply generation circuit 44. This provides the benefit of suppressing the fluctuations in the internal power supply voltage without increasing the chip size.

It should be understood that the present invention when embodied is not limited to the embodiments described above in specific terms and that various modifications, variations and alternatives may be made of the invention so far as they are within the scope of the appended claims or the equivalents thereof. Also, suitable combinations of the features explained in connection with the above-described embodiments may provide further variations of this invention as long as they are technically not in conflict with each other.

What is claimed is:

1. A multilayered semiconductor device comprising:
   a substrate; and
   a plurality of core chips layered in a vertical direction relative to the planar direction of the substrate, wherein each of the core chips includes:
   an internal power supply generation circuit that generates an internal power supply voltage supplied to an internal circuit in the core chip; and
   an internal power supply penetration electrode that allows an output of the internal power supply generation circuit to be shared by the core chips,
   wherein the internal power supply penetration electrode possessed by each of the core chips includes:
   an internal power supply terminal arranged over an upper surface of the core chip; and
   an internal power supply bump arranged over an underside of the core chip at a position corresponding to that of the internal power supply terminal over the upper surface when the core chips are layered.

2. The multilayered semiconductor device according to claim 1, wherein each of the core chips further includes:
   a reference voltage generation circuit that generates a reference voltage; and
   a reference voltage penetration electrode that allows an output of the reference voltage generation circuit to be shared by the core chips, and
   wherein the reference voltage penetration electrode possessed by each of the core chips includes:
   a reference voltage terminal arranged over the upper surface of the core chip;
   and a reference voltage bump arranged over the underside of the core chip at a position corresponding to that of the reference voltage terminal over the upper surface when the core chips are layered.

3. The multilayered semiconductor device according to claim 2, wherein the substrate includes:
   an external first power supply terminal that supplies the core chips with an external first power supply voltage supplied externally;
   an external second power supply terminal that supplies the core chips with an external second power supply voltage supplied externally; and
   an external third power supply terminal that supplies the core chips with the external first power supply voltage,
   wherein each of the core chips includes:
   an external first power supply penetration electrode that transmits the external first power supply voltage to the core chip immediately below or to the core chip immediately above the substrate;
   an external second power supply penetration electrode that transmits the external second power supply voltage to the core chip immediately below or to the core chip immediately above the substrate;
   an external third power supply upper-side electrode that is coupled to the external second power supply penetration electrode and transmits the external second power supply voltage to the core chip immediately above; and
   an external third power supply underside electrode that inputs the first power supply supplied from the external third power supply terminal from the substrate immediately below, and inputs the second power supply supplied from the third power supply upper-side electrode from the core chip immediately below, and
   wherein, in each of the core chips, the reference voltage generation circuit performs or stops generation of the reference voltage in accordance with the power supply supplied from the external second power supply penetration electrode and the external third power supply penetration electrode.

4. The multilayered semiconductor device according to claim 3, wherein the substrate includes a capacitance of which one end is coupled to the output of the internal power supply, the other end of the capacitance being coupled to the external second power supply terminal.

5. The multilayered semiconductor device according to claim 2, wherein the substrate includes:
   a first substrate power supply terminal that supplies the core chips with an external first power supply supplied externally;
   a second substrate power supply terminal that supplies the core chips with an external second power supply supplied externally; and
   a third substrate power supply terminal that supplies the core chips with the external first power supply;
   wherein each of the core chips includes:
   a first power supply bump, a second power supply bump, and a third power supply bump arranged over the underside of the core chip, the first, second, and third power supply bumps having the planar positions thereof corresponding to those of the first, second, and third substrate power supply terminals respectively;

a first power supply terminal, a second power supply terminal, and a third power supply terminal arranged over the upper surface of the core chip, the first, second, and third power supply terminals having the planar position thereof corresponding to those of the first, second, and third power supply bumps respectively;

a first power supply penetration electrode that couples the first power supply bump with the first power supply terminal; and a second power supply penetration electrode that couples the second power supply bump with the second power supply terminal, wherein the third power supply terminal is coupled to the second power supply penetration electrode, and wherein the reference voltage generation circuit receives the voltage supplied via the second and third power supply bumps as a power supply voltage.

6. The multilayered semiconductor device according to claim 1, wherein each of the core chips includes a metal layer arranged over a flat surface of the core chip and coupled to the output of the internal power supply.

7. The multilayered semiconductor device according to claim 1, wherein each of the core chips includes:
 a plurality of the internal power supply generation circuits that generate a plurality of the internal power supplies respectively; and
 a plurality of the internal power supply penetration electrodes coupled to the outputs of the internal power supply generation circuits respectively.

8. The multilayered semiconductor device according to claim 1, wherein each of the core chips includes a storage circuit that operates when supplied with the internal power supply.

9. The multilayered semiconductor device according to claim 8, wherein the storage circuit has memory addresses corresponding to a memory bank switchable from one core chip to another.

10. The multilayered semiconductor device according to claim 1, wherein the internal power supply bump is insulated from the terminals arranged over the substrate.

* * * * *